(12) United States Patent
Godet et al.

(10) Patent No.: US 8,460,569 B2
(45) Date of Patent: Jun. 11, 2013

(54) METHOD AND SYSTEM FOR POST-ETCH TREATMENT OF PATTERNED SUBSTRATE FEATURES

(75) Inventors: Ludovic Godet, Boston, MA (US); Christopher R. Hatem, Salisbury, MA (US); Patrick M. Martin, Ipswich, MA (US); Timothy J. Miller, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 20 days.

(21) Appl. No.: 13/081,692

(22) Filed: Apr. 7, 2011

(65) Prior Publication Data

US 2012/0258600 A1    Oct. 11, 2012

(51) Int. Cl.
 B44C 1/22 (2006.01)
 C03C 15/00 (2006.01)
 C03C 25/68 (2006.01)
 C23F 1/00 (2006.01)

(52) U.S. Cl.
 USPC .................................. 216/87; 216/62; 438/705

(58) Field of Classification Search
 USPC ........................................ 216/87, 62; 438/705
 See application file for complete search history.

(56) References Cited

U.S. PATENT DOCUMENTS

| | | |
|---|---|---|
| 2006/0008993 A1 | 1/2006 | Song et al. |
| 2010/0255683 A1 | 10/2010 | Godet et al. |
| 2011/0223546 A1 | 9/2011 | Godet et al. |
| 2012/0082942 A1 | 4/2012 | Godet et al. |

*Primary Examiner* — Roberts Culbert

(57) ABSTRACT

A method of patterning a substrate, comprises providing a set of patterned features on the substrate, exposing the set of patterned features to a dose of ions incident on the substrate over multiple angles, and selectively etching exposed portions of the patterned features.

7 Claims, 8 Drawing Sheets

METHOD AND SYSTEM FOR POST-ETCH TREATMENT OF PATTERNED SUBSTRATE FEATURES

BACKGROUND OF THE INVENTION

1. Field of the Invention

Embodiments relate to the field of device manufacturing. More particularly, the present invention relates to a method, system and structure for patterning a substrate and for implanting into a substrate.

2. Discussion of Related Art

Optical lithography is often used in manufacturing electronic devices. Referring to FIG. 1a-1e, there are shown simplified illustrations of an optical lithographic process. Generally, the substrate 112 is coated with photo-curable, polymeric photoresist 114 (FIG. 1a). Thereafter, a mask 142 having a desired aperture pattern is disposed between the substrate 114 and a light source (not shown). The light 10 from the light source is illuminated onto the substrate 112 via the aperture of the mask 142, and the light transmitted through the mask's aperture (or the image of the pattern) is projected onto the photoresist 114. A portion of the photoresist 114a is exposed to the light 10 and cured, whereas the rest of the photoresist 114b remains uncured (FIG. 1b). As a result, an image of the mask's aperture may form by the cured portion of the photoresist 114a.

As illustrated in FIG. 1c, the uncured portion of the photoresist 114b is stripped, and 3D photoresist feature or relief 114a corresponding to the mask's aperture pattern may remain on the substrate 112. Thereafter, the substrate is etched, and trenches 116 corresponding to the negative image of the mask's aperture pattern may form (FIG. 1d). After the remaining photoresist 114b is removed, a patterned substrate 112 may form (FIG. 1e).

Referring to FIG. 2, there is shown a conventional optical lithographic system 200 for projecting the image of the mask's aperture pattern to the substrate. The optical lithography system 200 comprises a light source 222, an optical integrator 232, and a condenser lens 234. In addition, the optical lithography system 200 comprises mask 142 having a desired aperture pattern and a projection lens 252. As illustrated in the figure, light having desired wavelength is emitted from the light source 222 to the optical integrator 232 and the condenser lens 234, which are collectively known as an illuminator 230. In the illuminator 230, the light 10 is expanded, homogenized, condensed, or otherwise conditioned. The light 10 is then illuminated onto the mask 142 having the desired aperture pattern to be projected onto the substrate 112. The light 10 transmitted through the apertures of the mask 142 may contain the information on the mask's aperture pattern. The light 10 is then captured by the projection lens 252 which projects the light 10 or the image of the mask's aperture pattern onto the photoresist deposited on the substrate 112. In projecting the image, the projection lens 10 may reduce the image by a factor of four or five.

Although optical lithography is an efficient process with high throughput, the process is not without disadvantages. One disadvantage may include line width roughness (LWR) or line edge roughness (LER). As known in the art, LWR is excessive variations in the width of the photoresist feature formed after uncured portion of the photoresist 114b is stripped from the substrate. If the variations occur on the side surface of the photoresist relief or feature, the variations is known as LER. The roughness or variations due to LWR or LER may be disadvantageous as the variation may be transferred onto the trenches during etch and ultimately to the circuit. The variations become more significant with decrease in feature size of the photoresist relief or trenches. For 32 nm devices variations of 4 nm or larger have been observed. Because the geometrical shape of a patterned resist feature, including line roughness effects, such as LWR and LER, is transferred from a resist layer to an underlying permanent layer of a device during patterning of the underlying layer, LWR and LER can limit the ability to form devices of acceptable quality for dimensions below about 100 nm. Such variations may lead to non-uniform circuits and ultimately device degradation or failure. In addition, depending on design criteria, device performance may be impacted more by either one of short, medium, or long range roughness.

Several approaches have been attempted to address LWR and LER effects. In one example, dry chemical etch process have the ability to remove resist, but generally suffer from pattern dependent loading effects, in which the removal is different in densely patterned regions as opposed to isolated features. Such dry chemical etching processes may also impart unwanted defects into a resist pattern, which could result in yield loss.

Moreover, photoresist is typically sensitive to ions, electrons, UV radiation, temperature variations, and other features that are part of the lithography process. This creates a challenge to develop improved resist patterning techniques that are robust and stable over different process conditions, such as substrate temperature, post lithography etch conditions, etc.

In addition to the above issues, resist trim processes in which the resist critical dimension (CD) is deliberately reduced, may increase sidewall roughness in resist features.

In view of the above, it will be appreciated that there is a need to improve patterning technologies requiring very small feature sizes, such as sub-100 nm CD devices.

SUMMARY OF THE INVENTION

Embodiments of the present invention are directed to methods and systems for improving patterning a substrate, in particular, by improving roughness in a set of substrate after formation of the substrate features. In one embodiment, A method of patterning a substrate comprises providing a set of patterned features on the substrate. The method further comprises exposing the set of patterned features to a dose of ions incident on the substrate over multiple angles and selectively etching exposed portions of the patterned features.

In another embodiment, a method of patterning small features in a substrate comprises patterning a resist layer disposed on the substrate, etching the substrate while the patterned resist layer is in place, and removing the patterned resist layer. The method further comprises exposing patterned substrate features to an exposure of ions at a set of angles so as to create altered portions of the sidewalls and selectively etching the altered portions of the sidewalls.

DESCRIPTION OF EMBODIMENTS

Figure 1A:
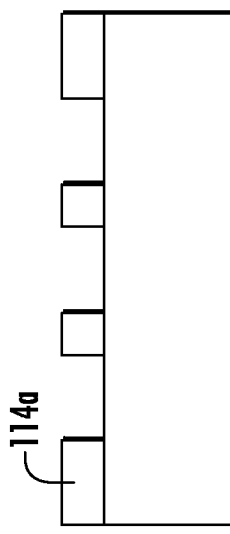
FIGS. 1a-1e are schematic cross-sections of a substrate that illustrate steps of a conventional optical lithographic process.
Figure 1B:
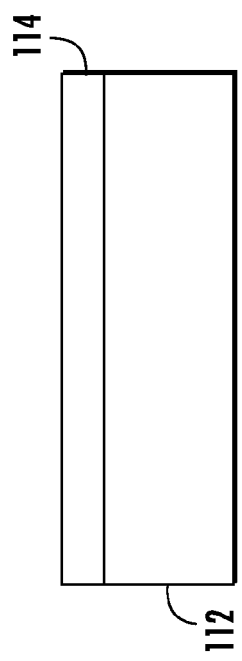
Figure 1C:
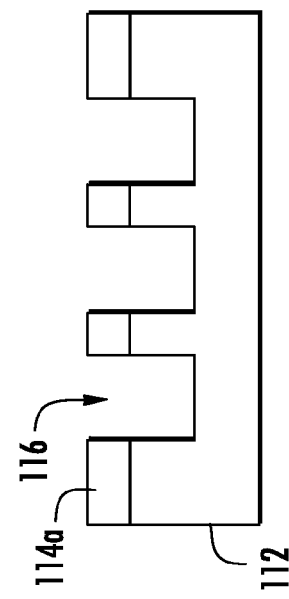
Figure 1D:
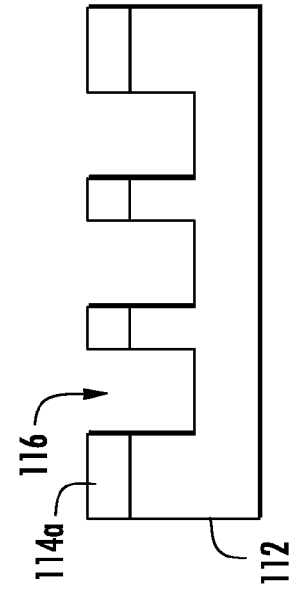
Figure 1E:
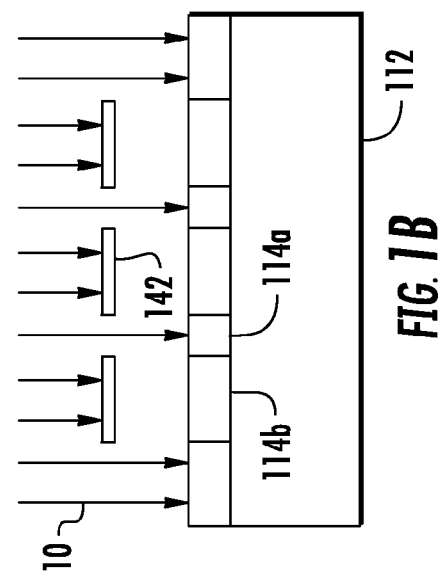
Figure 2:
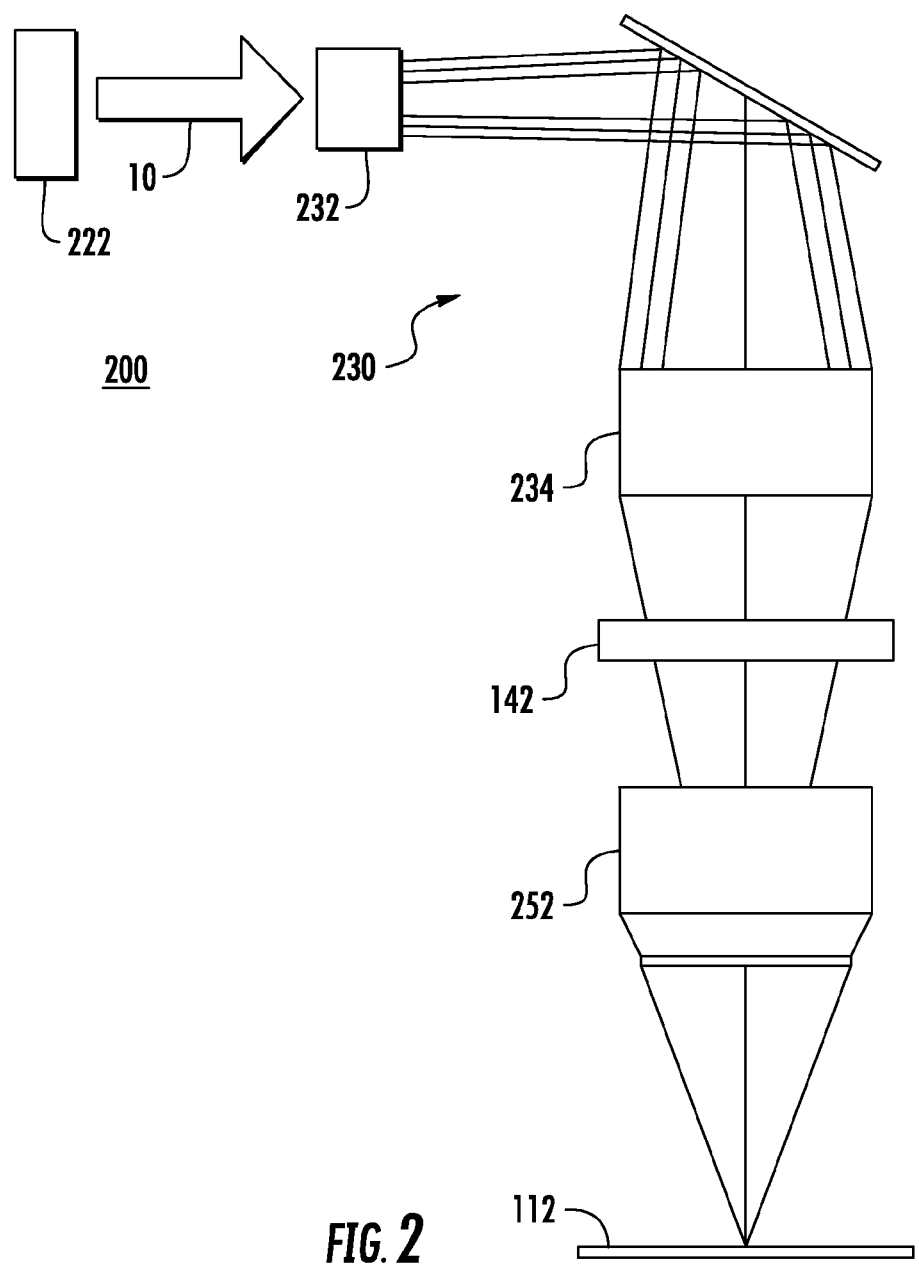
FIG. 2 is a schematic depiction of a conventional optical lithographic system for projecting the image of a mask's aperture pattern onto a substrate.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques and systems for patterning a substrate are introduced. In particular, the present disclosure focuses on techniques involving ion implantation processes for improving the quality of patterning a substrate, such as improving LWR and LER in patterned narrow substrate features. The methods disclosed herein may be used in conjunction with lithography processes including conventional DUV lithography, double patterning lithography, self aligned double patterning lithography, and other lithographic processes. However, those of ordinary skill in the art will recognize that the techniques disclosed herein are not limited to use in conjunction with any particular lithography or any range of resist feature dimensions.

Some embodiments of the invention employ plasma-based ion implantation processes to treat resist features having very small dimensions, while other embodiments may employ beam line implantation systems. For the purposes of clarity and simplicity, the embodiments are described as techniques for processing patterned substrate features having surfaces oriented at multiple angles. However, those of ordinary skill in the art will recognize that the present disclosure is not limited thereto. The structure may be any type of structure having surfaces oriented at different angles.

The embodiments are also described as techniques using ion based substrate processing systems. However, those of ordinary skill in the art will recognize that other types of sub-atomic, atomic, or molecular particle based substrate processing systems, including plasma sputtering, as well as beam line ion implantation systems, are within the scope of the present disclosure.

In various embodiments, processes for improving roughness in patterned substrate features involve exposing the patterned features to ion bombardment. The patterned substrate features of the present embodiments are generally three dimensional (3-D) in nature and may be defined by a set of sidewalls as well as a top surface. In some embodiments the patterned substrate features may be single crystal features, such as single crystalline silicon fins that may be used as a precursor to a finFET device. In other embodiments, the patterned features may be polycrystalline material, such as polysilicon gate material, while in still other embodiments, the patterned features may be insulating materials, including amorphous oxides or amorphous nitrides. Such patterned features may have a CD of about 100 nm or less and may exhibit LWR or LER in the range of a few nanometers up to tens of nanometers. However, embodiments in which the CD is larger than 100 nm and the LWR and LER are concomitantly larger are also possible.

In accordance with various embodiments, as detailed below with respect to FIGS. 3-7, the sidewalls (as well as tops) of patterned substrate features may be exposed to ion bombardment at one or more angles of incidence. The exposure to ion bombardment may alter an outer region of the sidewalls extending inwardly from the sidewall outer surface. The altered region may subsequently be subjected to etching in a manner that selectively etches the altered regions of the patterned features, resulting in a set of etched patterned substrate features having smoother sidewalls.

One defining feature of the present embodiments is that smoothening of sidewalls of patterned substrate features may be decoupled from photoresist processes used to define the basic patterned substrate feature shape. In other words, in contrast to prior art techniques, in which the final shape of the patterned substrate features may be defined in large part by the resist (and/or) hard mask features, including any sidewall roughness of the patterned resist, the sidewall roughness in the present embodiments may be substantially altered after initial etching of the substrate to form of the patterned substrate features. This ability to alter the substrate sidewalls after resist patterning and etching may help relax constraints placed upon the photolithographic steps, since the effect of resist roughness on eventual substrate features may at least be partially erased by subsequent treatment afforded by the present embodiments.

Figure 3C:
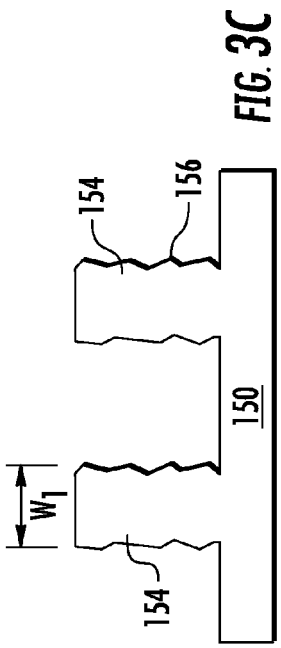
FIGS. 3a-e depict in cross-sectional side view exemplary steps involved in an embodiment of substrate patterning.
Figure 3D:
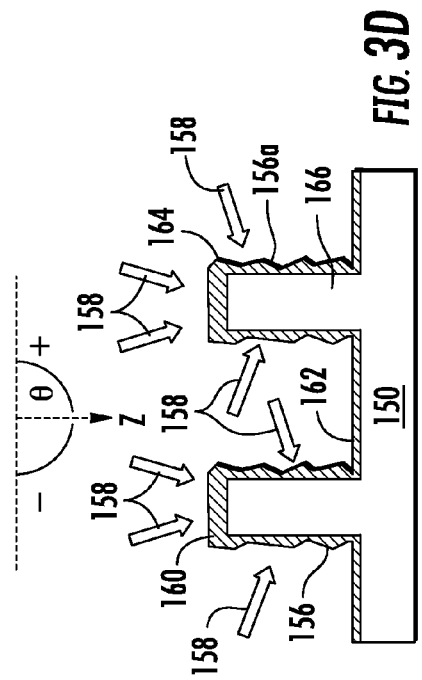
Figure 3E:
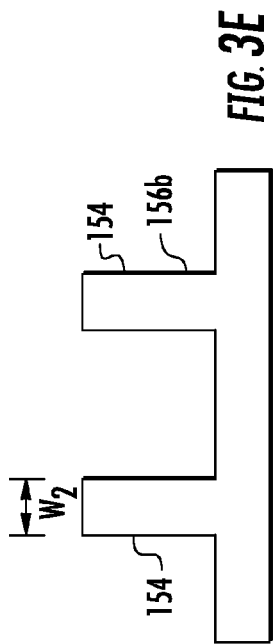
Figure 3A:
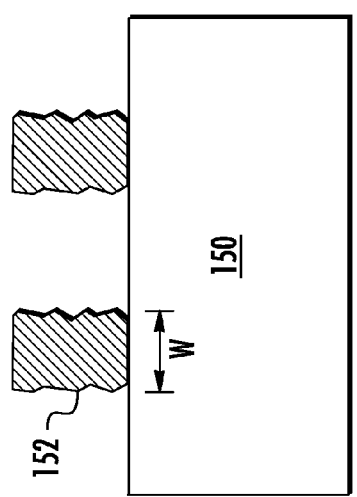
Figure 3B:
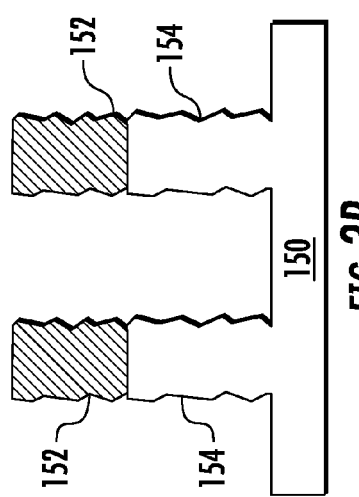
Figure 3H:
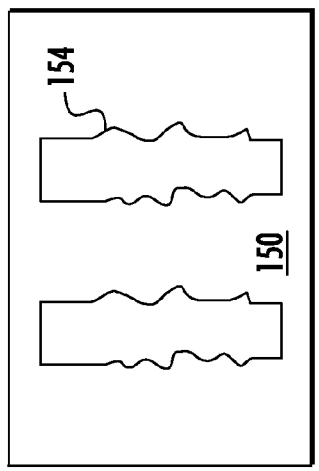
FIGS. 3f-j depict in top plan view the steps depicted in FIGS. 3a-e, respectively.
Figure 3I:
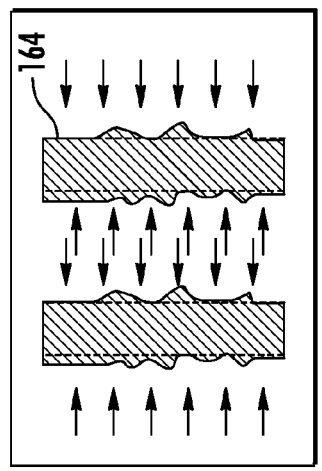
Figure 3J:
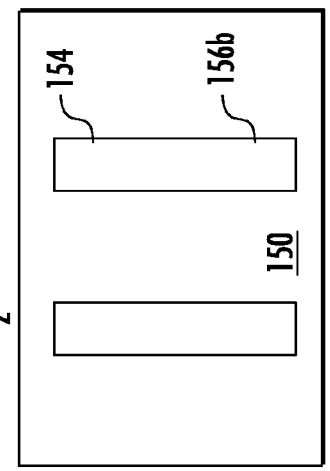
Figure 3F:
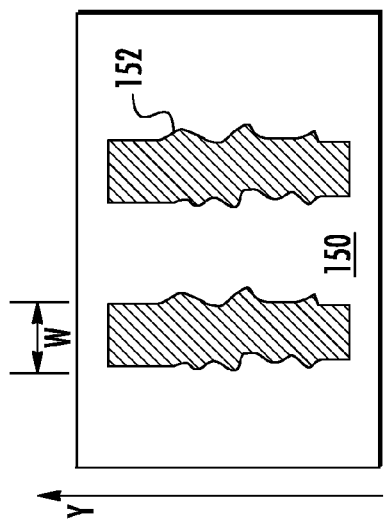

FIGS. 3a-3e and 3f-j illustrate in side cross-sectional view and top plan view, respectively, one embodiment of substrate patterning in which sidewalls of patterned substrate features are smoothened after the substrate features are patterned using the overlying resist. In FIGS. 3a,3f patterned photoresist features 152 having width W are disposed on a substrate 150. As used herein, the term "substrate" may generally refer to a bulk portion of a substrate such as a single crystal silicon substrate, or may refer to any regions or layers that may be disposed on a bulk substrate, where the regions or layers may remain integral to the substrate after processing. Thus, the term "substrate" generally refers to material that may remain after photoresist and/or any non-permanent hardmask layers are removed. Among others, the term substrate therefore encompasses single crystalline bulk silicon (or other semi-conductors), single crystalline silicon layers, oxide or nitride layers, and polycrystalline layers such as polysilicon or metals, any of which may be patterned.

The patterned photoresist features 152 may be formed by known photolithographic processes. The patterned features 152 may represent an array of many similar features. In some embodiments, features 152 may be photoresist features that have already undergone sidewall smoothening processes. However, in other embodiments no smoothening processes may be performed on the photoresist features.

Figure 3G:
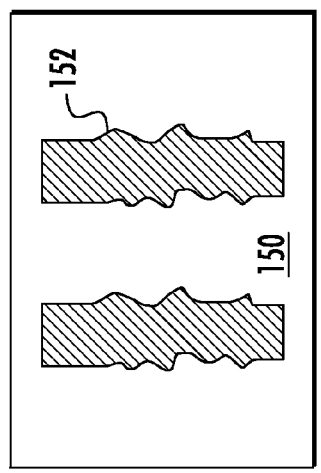

In a subsequent step illustrated in FIGS. 3b,3g the substrate 150 is etched with the resist 152 in place so that the pattern of resist 152 is transferred into substrate 150, thereby forming patterned substrate features 154. In various embodiments, the substrate etching may be performed according to known anisotropic etching processes, such as reactive ion etching. In some embodiments, a hard mask layer or antireflection layer (not shown) may be provided between the substrate 150 and resist features 152. In embodiments employing a hard mask, the patterned hard mask (not shown) is disposed between resist features 152 and patterned substrate features 154.

In some embodiments, substrate 150 and features 154 may represent a monolithic structure, such as single crystal silicon. However, in other embodiments, the base portion of substrate 150 may be different than features 154. For example, the base portion may contain an oxide layer that supports silicon features 154.

In a subsequent step illustrated at FIGS. 3c,3h the resist (as well as any hardmask layer) may be removed, leaving patterned substrate features 154 having substantial sidewall roughness as shown. As noted above, the sidewall roughness exhibited on features 154 (especially in-plane roughness along the y-direction illustrated in FIG. 3h) may be in large part a result of transfer of sidewall roughness from resist features 304. However, other factors may also contribute to the sidewall roughness of substrate features 154, including the nature of the etching process used to etch substrate 150, as well as the nature of substrate 150. For example, if substrate 150 is a polycrystalline layer, such as polysilicon or polysilicon-germanium, the polycrystalline grains in the narrow features 154 may etch in a non-uniform manner, which may add to roughness along the sidewalls.

In a further step illustrated at FIGS. 3d,3i ions are provided toward patterned substrate features 154. In the example illustrated, the ions 158 may be provided over a range of angles between −θ and +θ with respect to direction Z (see FIGS. 5a,5b for further details regarding distribution) in a manner that ions impinge on sidewalls 156. The ions may also impinge on top regions 160 of the patterned features 154 as well as lower planar regions 162 of substrate 150. As shown, the ions 158 may create an altered region 164 whose outer surface 156a is the outer surface of the patterned features 154. The altered region may form because ions 158 impact substrate 150 and implant into the substrate and/or cause displacements of atoms, charge centers, and other changes in the microstructure of a portion of substrate 150 indicated by region 164. In some embodiments, the implanted ions may also act to change the composition and boding of atoms within the altered region.

In various embodiments, the altered region 164 may form on the patterned feature top surfaces 160, sidewalls 156 and lower planar surfaces 162 of substrate 150. As detailed below, the ions may be provided by apparatus such as ion implantation systems, including beamline and plasma-based systems.

In accordance with some embodiments, the ion species, dose and energy of ions 158 may be controlled in order to control factors such as the thickness and distribution of region 164, as well as the nature of region 164. For example, a 4 keV, 5 E15 ion dose implant (with an ion angular distribution up to 45 degrees from normal) may amorphize to a depth of about 9 nm on a sidewall, while a 2 keV implant of similar dose and angular distribution may amorphize to a depth of about 4 nm. After exposure to ions 158, region 164 may become sufficiently altered that it becomes susceptible to etchants. In accordance with various embodiments, the exposure to ions 158 may be arranged such that region 164 becomes selectively etchable with respect to underlying portions of substrate 150.

Once a selectively etchable layer 164 is formed, substrate 150 may be subjected to an etchant, as illustrated in FIGS. 3e,3j. In various embodiments, the etchant may be chosen such that it etches region 164 with a high selectivity over underlying regions of substrate 150. Thus, at the step illustrated in FIGS. 3e,3j all of region 164 may be removed by a selective etchant that leaves the underlying regions 166 of patterned features 154 intact. In some embodiments the etchant may be a wet chemical etch, while in other embodiments the etchant may be a reactive gas/reactive ion etchant. In some embodiments, the etching may be performed as a timed etch, while in other embodiments, an untimed etch may be performed. It will be apparent to those of ordinary skill that the selection of timed as opposed to untimed etching may be based on the etch selectivity between regions 164 and 166.

In some embodiments in which the patterned features 154 are crystalline materials, such as silicon, the exposure to ions 158 may be arranged to amorphize the surface regions of the patterned features, such that the regions 164 represent amorphous silicon, and the regions 166 represent crystalline silicon. Accordingly, an etchant may be selected that etches amorphous silicon faster than crystalline silicon. In an example of a wet etchant, HF is known to etch amorphous silicon, while HF does not etch crystalline silicon. Reactive ion etching gas compositions are also known that provide a greater etch rate of amorphous silicon that crystalline silicon.

In accordance with some embodiments, for example, if substrate 150 is a crystalline semiconductor, an ion implantation step be performed after selective removal of an amorphized layer in order to introduce desired dopants into the substrate. Subsequently, activation annealing may be performed to recover any residual damage caused by dopant implantation and/or the amorphizing implantation depicted in FIG. 3d.

In various embodiments, the ions 158 may be inert gas ions. However, in other embodiments, the ions may be other elements, such as semiconductor dopant ions, oxygen, nitrogen, fluorocarbons, hydrogen-containing ions, mixtures of said ions, and other ions.

In some embodiments, patterned substrate features 154 may be insulators, such as amorphous oxides or nitrides. In such materials, or in other materials having an amorphous microstructure, ions 158 may be arranged to provide a chemical alteration of the outer regions of features 154, such that the composition of layer 164 is sufficiently different from that of region 166 as to confer upon layer 164 a higher etch rate using an appropriate etchant. For example, if patterned features 154 are a silicon oxide material, ions 158 may be arranged to contain nitrogen, such that implanted region 164 is an oxynitride having a higher etch rate than the underlying oxide using the appropriate etchant.

In accordance with various embodiments, after removal of region 164, the resulting surface, such as the sidewall surfaces 156b may be smoother than the initial sidewall surface 156a before removal of the selectively etchable regions. Thus, the etch process may act to remove protrusions of the initial surface 156a such that remaining surface 156b has a smoother profile. This may be a result of the exposure to ions 158, which may tend to intercept and alter protruding areas of sidewalls 156.

Figure 4A:
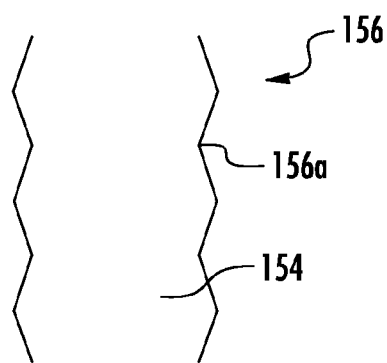
FIGS. 4a-4c depict details of exemplary sidewall processing steps.
Figure 4B:
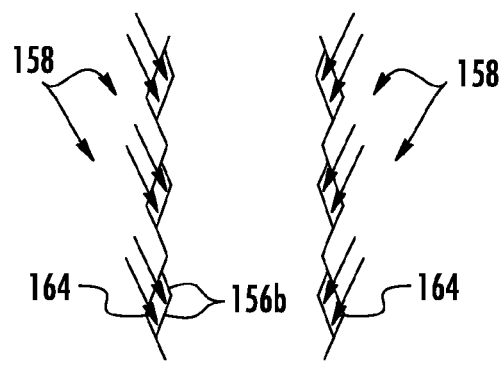
Figure 4C:
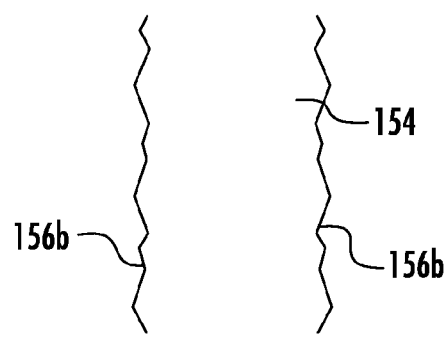

FIGS. 4a-c illustrate an embodiment of sidewall smoothening using ion bombardment and etching. The figures may represent a plan view of patterned features 154 or may represent a cross-sectional view. In FIG. 4a feature 154 exhibits an initially rough sidewall 156 characterized by a surface 156a. In the step illustrated at FIG. 4b ions are provided toward surface 156a at a particular angle of incidence and energy, creating altered regions 164 as shown. The inner side of altered regions 164 corresponds to an interface 156b that generally defines the limit of the damaged region in which the etch rate for a given etchant differs from unaltered regions of features 154. Subsequently, as illustrated in FIG. 4c, the altered regions 164 are removed, leaving interface 156b as the new outer surface of sidewalls 156. Depending upon the angle(s) of ion incidence, among other factors, the new surface 156b may have lesser roughness than original surface 156a, as suggested by the FIGS. 4a-4c. Although FIGS. 4a-c only illustrate the effect of smoothening for one angle of incidence, ions provided at other angles may provide additional smoothening, which, in concert, may confer substantial improvements in overall line edge roughness and line width roughness.

In addition to improving sidewall roughness, in various embodiments, the exposure to ions 158 may be arranged to provide a desired decrease in CD of patterned features. For example, in the case where features 154 represent crystalline silicon fins, the ion species, energy and/or ion dose may be arranged to amorphize the silicon fins to a desired average depth, such that the width of fins 154 is reduced from an initial average width W1 of rough fins to a final desired width W2 corresponding to the width of unaltered region 166. In accordance with some embodiments, the substrate temperature may be arranged to be relatively higher or lower to facilitate amorphizing the amount of material desired for removal.

Figure 5A:
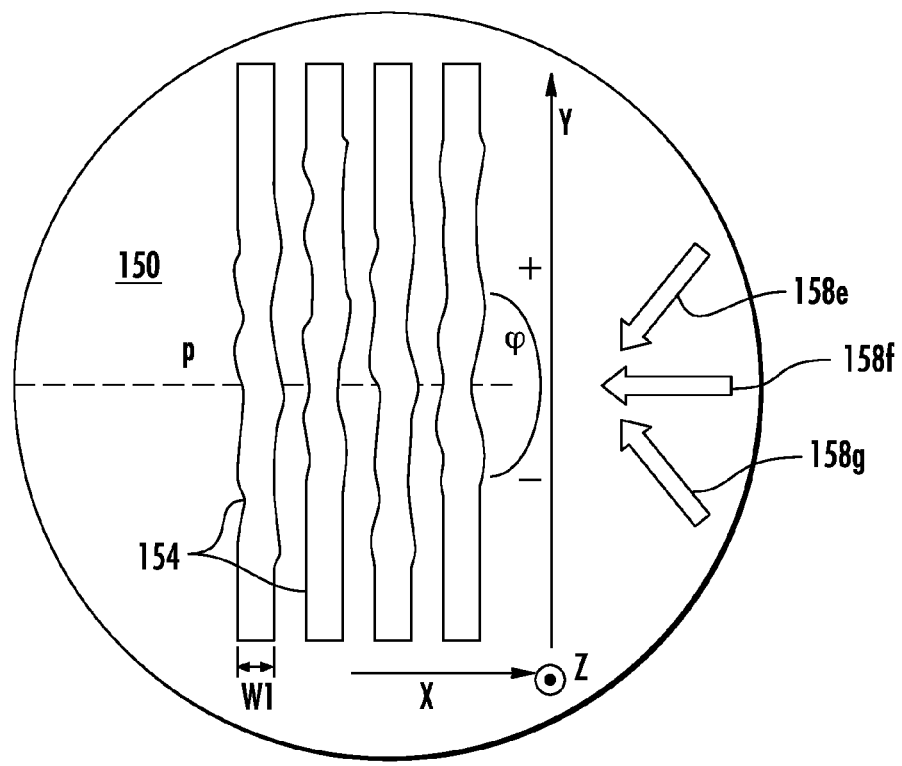
FIGS. 5a and 5b depict a top plan view and side cross-section view, respectively, of an exemplary substrate patterning process.
Figure 5B:
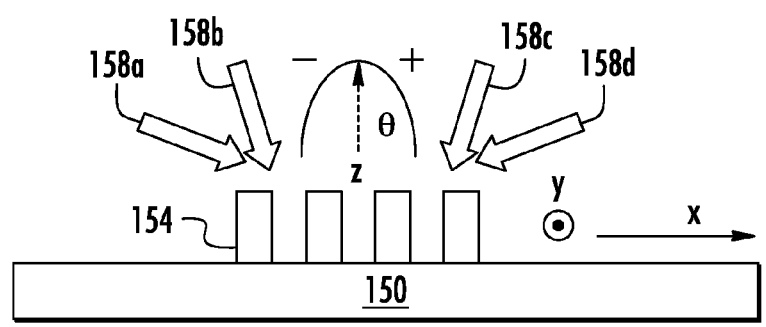

It is to be emphasized that the process generally outlined in FIGS. 3a-j may be used to improve sidewall roughness both in the vertical direction as well roughness in the horizontal direction (that is, roughness that may be characterized by LER and LWR discussed above) along the length of patterned features 154. FIGS. 5a and 5b depict a top plan view and side view illustrating further details of ion bombardment geometry of a patterned substrate features 154 in accordance with various embodiments. When describing the ions 158, it is useful to define a coordinate system wherein the X axis is horizontal and in the plane of substrate plane 150, the Y axis is vertical and in the substrate plane 150, and the Z axis is perpendicular to the plane of substrate plane 150, as depicted in FIG. 5a. Ions 158a-g may represent streams of ions that are provided to substrate 150 in one or more exposures, depending on the apparatus used to provide the ions, as detailed below. As shown in FIG. 5b, ions 158a-d are incident upon substrate 150 over a range of angles θ with respect to the Z direction. As illustrated in FIG. 5a, ions 158e-g are incident upon substrate 150 at a range of angles ϕ defined with respect to the X-direction. It is to be noted that ions 158e-g are also preferably arranged such that they define an angle θ that is less than 90 degrees with respect to the Z-direction, that is, the ions are not parallel to the plane of substrate 150.

Figure 6:
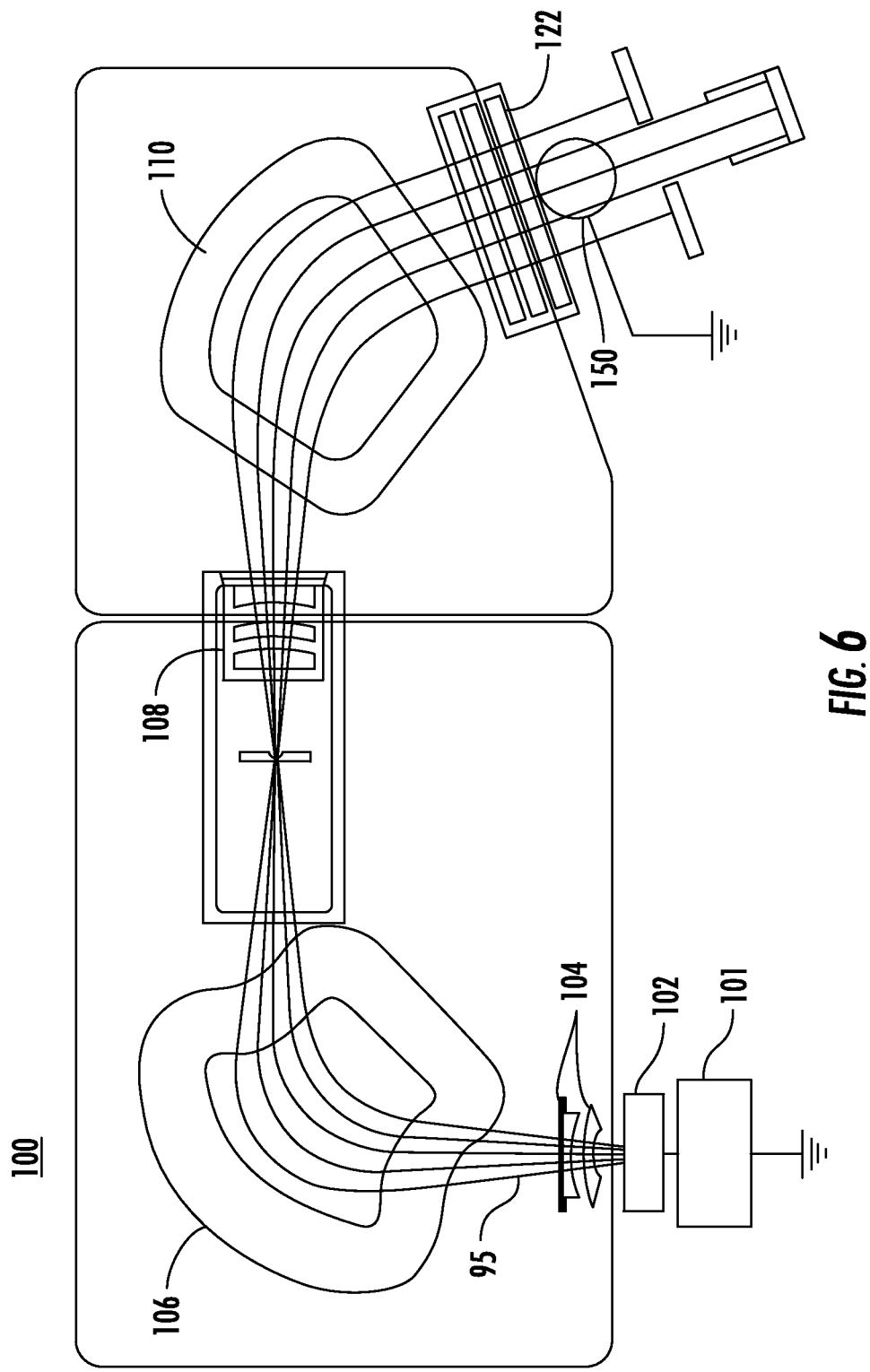
FIG. 6 depicts a schematic of a beam line ion implanter.

According to various embodiments, the ions 158 may be provided by ion implantation systems, as illustrated in FIGS. 6 and 7. FIG. 6 depicts a block diagram of an ion implanter that illustrates general features of beam line ion implanter that may be used in embodiments of the present invention. System 100 includes an ion source chamber 102. A power supply 101 supplies the required energy to source 102 which is configured to generate ions of a particular species. The generated ions are extracted from the source through a series of electrodes 104 (extraction electrodes) and formed into a beam 95 which passes through a mass analyzer magnet 106. The mass analyzer is configured with a particular magnetic field such that only the ions with a desired mass-to-charge ratio are able to travel through the analyzer. Ions of the desired species pass through deceleration stage 108 to corrector magnet 110. Corrector magnet 110 is energized to deflect ion beamlets in accordance with the strength and direction of the applied magnetic field to provide a beam targeted toward a work piece or substrate 150. The ions lose energy when they collide with electrons and nuclei in the substrate and come to rest at a desired depth within the substrate based on the acceleration energy.

In various embodiments, ions within ion beam 95 may be parallel to one another such that the ions are incident upon substrate 150 at a single angle at any given instant. In accordance with some embodiments, this incidence angle may comprise a combination of angles θ and ϕ with respect to the orientation of patterned features 154, as shown in FIG. 5. Referring again to FIGS. 5a and 5b, in some embodiments, ions 158 may be provided by a beam-line implanter such as system 100 in a series of exposures in which the angles θ and/or ϕ are changed between exposures. Alternatively, the angles θ and/or ϕ may be varied while substrate 150 undergoes a continuous single exposure to ions.

Figure 7A:
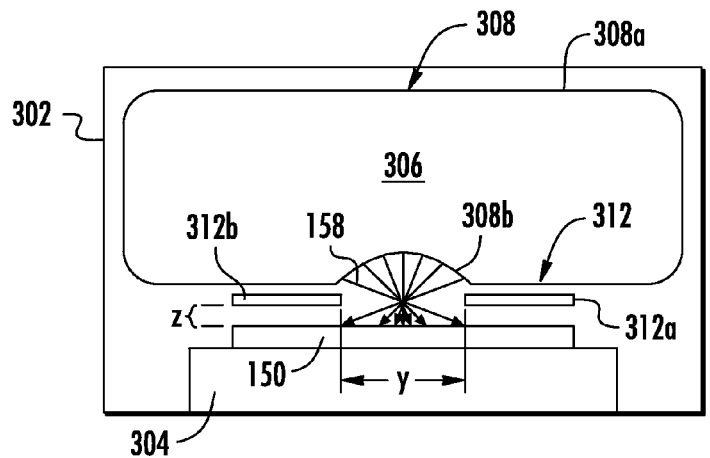
FIG. 7a depicts a cross section of another ion implantation system.
Figure 7B:
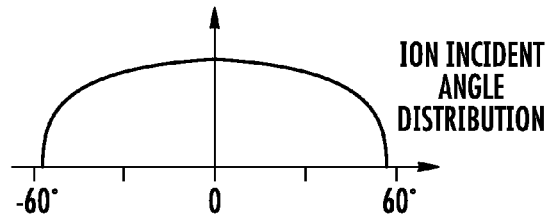
FIG. 7b depicts a curve illustrating angular ion distribution of ions from the implanter of FIG. 5a according to one embodiment.

In various other embodiments, ions 158 may be provided to patterned substrate features using ion implantation systems that provide a range of angles of incidence at the same time. Referring to FIG. 7a, there is shown a substrate processing system 300 for processing 3D structures according to embodiments of the present invention. FIG. 7b illustrates an exemplary angular distribution of the ions (or particles) that may be provided by system 300 to a substrate 150. The figures are not necessarily drawn to scale.

As illustrated in FIG. 7a, the system 300 may include a process chamber 302 in which the substrate 150 and a platen 304 supporting the substrate 150 are disposed. The system 300 may also include a plasma source (not shown) for generating plasma 306 contained in the processing chamber 302. The plasma source may be an in situ or remote, inductively coupled plasma source, capacitively coupled plasma source, helicon source, microwave source, or any other type of plasma source.

Between the plasma 306 and the substrate 150, one or more plasma sheath modifiers 312 may be disposed. In various embodiments, the plasma sheath modifier 312 may comprise a pair of modifier parts 312a and 312b spaced apart from one another by a gap "y" or may comprise a single plate having a slot that defines the gap.

The plasma sheath modifier 312 may be capable of adjusting the electric field of the plasma sheath. In some embodiments, the plasma sheath modifier 312 may be positively or negatively charged. The plasma sheath modifier 312 may be made from electrically insulating (e.g. quartz) or conducting (e.g. metallic) material, or a combination thereof. Alternatively, the plasma sheath modifier 312 may be made from semiconducting (e.g. Si) material. If the system 300 includes more than one modifier parts, the parts may be made from the same or different material. For example, the system 300 may include a plasma sheath modifier 312 comprised of two modifier parts 312a and 312b. The modifier parts 312a and 312b may be made from the same material or different materials.

As depicted in the Figures, sheath 308 is represented by a boundary of the sheath with plasma 306. However, it will be understood that sheath 308 may extend a finite distance from an edge of plasma 306 to surfaces of objects around plasma 306, for example, the sheath 308 may extend to the surface of substrate 150.

The ions 310 in the plasma sheath 308 or the plasma 306 may be directed toward the substrate 150, as the substrate 112 is biased by a DC or RF bias supply (not shown). The bias signal applied to the substrate 150, whether DC or RF, may be continuous or pulsed.

The plasma sheath modifier 312 may modify the shape of the plasma sheath 308 so as to control the incident angle distribution of the ions 310. For example, the plasma sheath modifier 312 may modify the electric field in the plasma sheath 242 and modify the shape of the plasma sheath 308. In the present embodiment, the plasma sheath modifier 312 may modify at least a portion of the sheath 308 into a concave shaped plasma sheath 308b (modified sheath 308b) relative to the bulk plasma 306, or a dome shaped (convex) plasma relative to the bulk plasma 306. Compared to the substrate 150, the shape of the modified sheath 308b may be non-parallel relative to the plane defined by the substrate 150. When the substrate 150 is biased, the ions 310 attracted toward the substrate 150 may travel through the gap "y" between the modifier parts 312a and 312b at a large range of incident angles. In the conventional plasma based processing systems, the plasma sheath closest to the substrate lies parallel to the substrate. When the substrate is biased, the ions travel in a path substantially perpendicular to the plasma sheath, thus substantially perpendicular to the substrate. As a result, the ions in the conventional plasma processing system have incident angles ranging from $-5°$ to $+5°$, and typically have incident angles close to zero degrees. In the present embodiment, however, the incident angle of the ions 310 may be modified with the modified sheath 308b. As illustrated in FIG. 7a, the modified sheath 308b is multi-angled relative to the substrate. As such, ions 310 traveling perpendicular to the modified sheath 308b may travel in multiple angles. The ions 310 traveling toward the substrate 150 from different portions of the modified sheath 308b may have different incident angles, and the ions 310 will therefore have a large range of incident angles. As illustrated in FIG. 7b, the incident angles of the ions 310 may range between about $+60°$ to about $-60°$, centered about $0°$. In some embodiments, the incident angles of the ions 310 may additionally be modified by the electric field generated by the plasma sheath modifier 312.

Depending on a number of factors including, but not limited to, configurations and properties of the plasma sheath modifier 312, the incident angle of the ions may be additionally modified. Example of such factors may include the horizontal spacing (Y) between the modifier parts 312a and 312b, the vertical spacing (Z) between the modifier 312 and the substrate 150, difference in the vertical spacing (z) between the substrate 150 and each modifier parts 312a and 312b (not shown), and the electrical properties of the modifier 312. Other plasma process parameters may also be adjusted to adjust the incident angle and/or incident angle distribution of the ions. Additional description may be found in the co-pending U.S. patent application Ser. No. 12/418,120, 12/417,929, 12/644,103, and 12/848,354, each of which application, as noted above, is incorporated in its entirety by reference.

Figure 7C:
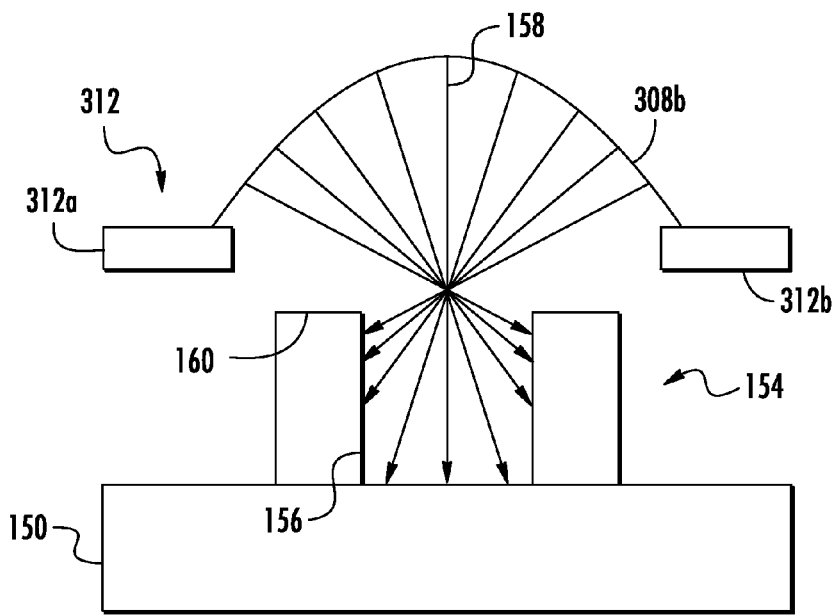
FIG. 7c depicts a close-up view of a substrate of FIG. 7a that illustrates an exemplary angular ion bombardment process.

As illustrated in FIG. 7c, ions 158 may be provided over a range of angles such that the ions impact sidewalls 156 over a range of angles. This range of angles may be useful in order to provide ions to various different portions of sidewalls 156 at the same time. Referring also to FIG. 5b, the arrangement in FIG. 7c depicts an example in which ions 158 are simultaneously provided to substrate 150 at a range of different angles θ as defined in FIG. 5b. However, in various embodiments, the substrate 150 may be rotated and/or tilted with respect to the orientation of FIG. 7c, such that ions 158 may be provided from system 300 over a range of angles of incidence that may be characterized by any combination of θ and/or φ.

As in the case of a beam-line ion implanter, ions 158 may be provided to substrate 150 in one or more exposures. The details of exposure conditions may be arranged according to the considerations such as the nature of the patterned feature roughness, the overall width of patterned features, the desired or maximum amount of CD reduction to be achieved, and other factors. For example, the roughness profile of patterned narrow substrate lines may be characterized by a combination of long range, mid range, and short range roughness, which profile may vary between device manufacturing processes. Accordingly, the ion exposure treatment, such as range of angles of incidence and dose may be tailored to the exact combination of roughness features.

In summary, the present invention provides novel and inventive methods and systems for reducing roughness in patterned features, such as patterned substrate features. The present invention can be deployed in systems that employ relatively low ion energy, such as plasma-based ion systems, which affords the ability to provide ions and other species that have only a small penetration depth into the patterned features. This facilitates the ability to provide surface smoothening without substantially impacting substrate feature pattern attributes, such as profile, and CD. In particular, near-surface regions of patterned feature sidewalls may be bombarded by a dose of ions in order to alter the surface regions so as to render them selectively etchable with respect to underlying regions. By appropriate choice of ion energy, dose, species, and angles of incidence, the removal of the altered surface regions may result in smoother sidewalls.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. As an example, embodiments may employ masking material on top of substrate features during ion bombardment so as not to reduce the height of a patterned feature if desired. Embodiments in which ions are directed at sidewalls over a single angle of incidence are also possible.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of patterning small features in a substrate, comprising;
    patterning a resist layer disposed on the substrate;
    etching the substrate while the patterned resist layer is in place to define patterned substrate features having sidewalls;
    removing the resist layer;
    exposing the patterned substrate features to ions at a set of incident angles to create altered portions of the sidewalls; and
    etching the altered portions of the sidewalls.

2. The method of claim 1, wherein the dose of ions is arranged to produce a damage interface within sidewalls of the patterned features that defines a smoother surface than an initial surface of the sidewalls.

3. The method of claim 1, wherein the patterned substrate features are one of a polycrystalline semiconductor, a single crystalline semiconductor, and an insulator material.

4. The method of claim 1, wherein the ions are arranged to implant into the substrate to a first depth so as to define an etch-resistant inner region having a predetermined thickness.

5. The method of claim 1, wherein the set of angles comprises a multiplicity of angles.

6. The method of claim 5, wherein the exposure comprises arranging the substrate at a multiplicity of orientations with respect to an ion beam of a beam-line implantation system.

7. The method of claim 1, wherein the exposure comprises an exposure to ions extracted from a plasma using a plasma sheath modifier that provides ions to the substrate over an angular range.

* * * * *